(12) United States Patent
Park

(10) Patent No.: US 12,156,386 B2
(45) Date of Patent: Nov. 26, 2024

(54) HEAT RADIATION MODULE AND ELECTRONIC DEVICE COMPRISING SAME

(71) Applicant: LG INNOTEK CO., LTD., Seoul (KR)

(72) Inventor: Sung June Park, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 183 days.

(21) Appl. No.: 18/018,010

(22) PCT Filed: Aug. 5, 2021

(86) PCT No.: PCT/KR2021/010358
§ 371 (c)(1),
(2) Date: Jan. 25, 2023

(87) PCT Pub. No.: WO2022/031086
PCT Pub. Date: Feb. 10, 2022

(65) Prior Publication Data
US 2023/0284425 A1    Sep. 7, 2023

(30) Foreign Application Priority Data
Aug. 5, 2020   (KR) .................. 10-2020-0097955

(51) Int. Cl.
*H05K 7/20*   (2006.01)
*H02M 7/00*   (2006.01)

(52) U.S. Cl.
CPC ......... *H05K 7/209* (2013.01); *H05K 7/20472* (2013.01); *H02M 7/003* (2013.01)

(58) Field of Classification Search
CPC .... H05K 7/209; H05K 7/20472; H02M 7/003
See application file for complete search history.

(56) References Cited

U.S. PATENT DOCUMENTS

| | | | |
|---|---|---|---|
| 7,529,094 B2 | 5/2009 | Miller | |
| 7,692,923 B2* | 4/2010 | Nakamura | H05K 7/20927 361/689 |
| 9,030,822 B2* | 5/2015 | Sharaf | H02M 7/493 174/15.1 |

(Continued)

FOREIGN PATENT DOCUMENTS

| JP | 2008-206243 A | 9/2008 |
|---|---|---|
| KR | 10-2018-0062493 A | 6/2018 |

(Continued)

*Primary Examiner* — Mukundbhai G Patel
(74) *Attorney, Agent, or Firm* — Birch, Stewart, Kolasch & Birch, LLP

(57) ABSTRACT

A heat radiation module comprises: a bracket having an upper surface, a lower surface, and a first side surface for connecting the upper surface and the lower surface, and a second side surface facing the first side surface; and a heat dissipation passage disposed in the bracket, wherein the bracket includes a groove formed on at least one surface among the upper surface and the lower surface, the heat dissipation passage includes a first passage disposed between one side of the groove and the first side surface and a second passage disposed between the other side of the groove and the second side surface, and a part of the first passage overlaps the groove extending in a direction from the first side surface toward the second side surface.

20 Claims, 9 Drawing Sheets

(56) References Cited

U.S. PATENT DOCUMENTS

2008/0198548 A1 8/2008 Nakamura et al.
2018/0294739 A1 10/2018 Chun et al.
2018/0343775 A1* 11/2018 Huang .................... H01L 25/18

FOREIGN PATENT DOCUMENTS

| KR | 10-2019-0011521 A | 2/2019 |
| KR | 10-2019-0105920 A | 9/2019 |

* cited by examiner

HEAT RADIATION MODULE AND ELECTRONIC DEVICE COMPRISING SAME

CROSS REFERENCE TO RELATED APPLICATIONS

This application is the National Phase of PCT International Application No. PCT/KR2021/010358, filed on Aug. 5, 2021, which claims priority under 35 U.S.C. 119(a) to Patent Application No. 10-2020-0097955, filed in the Republic of Korea on Aug. 5, 2020, all of which are hereby expressly incorporated by reference into the present application.

TECHNICAL FIELD

The present embodiment relates to a heat radiation module and electronic device comprising same.

BACKGROUND ART

A power supply device is a device that supplies electricity to electronic devices such as computers. Computers other than personal use cannot use the general power supply of homes or buildings, so 208V, 60 Hz which is an industrial power supply is used. However, this also requires a high-accuracy constant-frequency, constant-voltage device because the tolerance for frequency and voltage fluctuations is large. Since 60 Hz is the default for both American and Korean models, it must be converted to 60 Hz with a frequency converter in places where 50 Hz is being used.

An external shape of the electronic device is formed by the housing, and a plurality of electronic components for driving are disposed in the housing. The plurality of electronic components generates heat by being driven.

For heat dissipation, a heat dissipation structure including a fan for flowing air in the housing and a heat dissipation fin for increasing the surface area of the housing has been proposed, but it is difficult to arrange a number of electronic components and a heat dissipation structure considering the narrow space inside the housing.

DETAILED DESCRIPTION OF THE INVENTION

Technical Subject

The present embodiment is to provide a heat radiation module and electronic device comprising same capable of improving heat dissipation efficiency by improving the structure.

Technical Solution

A heat radiation module according to the present embodiment comprises: a bracket having an upper surface, a lower surface, and a first side surface for connecting the upper surface and the lower surface, and a second side surface facing the first side surface; and a heat dissipation passage being disposed inside the bracket, wherein the bracket includes a groove formed on at least one surface among the upper surface and the lower surface, wherein the heat dissipation passage includes a first passage being disposed between one side of the groove and the first side surface, and a second passage being disposed between the other side of the groove and the second side surface, and wherein a portion of the first passage is overlapped with the groove being extended in a direction directing from the first side surface toward the second side surface.

A heat radiation module according to another embodiment comprises: a bracket including a groove in which at least a portion of the heating element is disposed; and a heat dissipation passage being disposed inside the bracket, wherein at least one of one end and the other end of the heat dissipation passage is exposed on one surface of the bracket, wherein a portion of the heat dissipation passage is disposed adjacent to at least two side surfaces of the groove, and wherein the portion of the heat dissipation passage is overlapped with the groove in a first direction perpendicular to the side surface of the groove.

A heat radiation module according to the present embodiment comprises: a substrate; a heating element being electrically connected to the substrate; a bracket having a region in which at least a portion of the heating element is disposed; and a heat dissipation passage being disposed inside the bracket, wherein the heat dissipation passage includes a first passage being disposed on one side of the region and a second passage being disposed on the other side of the region, and wherein the heat dissipation passage is overlapped with the heating element in direction from a first direction directing from the first passage towards the second passage.

An electronic device according to another embodiment comprises: a substrate; a heating element being electrically connected to the substrate; a bracket having a region in which at least a portion of the heating element is disposed; and a heat dissipation passage being disposed inside the bracket, wherein the substrate includes a first substrate being disposed on one side of the bracket, a second substrate being disposed on the other side of the bracket, and a plate connecting the first substrate and the second substrate, wherein the heat dissipation passage is disposed between the first substrate and the second substrate, and wherein the heating element, the plate, and a portion of the heat dissipation passage are being overlapped in a first direction.

The heat dissipation passage may include a refrigerant pipe through which a refrigerant flows.

At least a portion of the bracket of the refrigerant pipe may be protruded towards an outer surface of the bracket.

The region may include a groove or space.

The heat dissipation passage may include a third passage connecting one end of the first passage and one end of the second passage.

The other end of the first passage is exposed to one surface of the bracket, one end of the first passage is connected to one end of the third passage, the other end of the second passage is exposed to one surface of the bracket, and one end of the second passage may be connected to the other end of the third passage.

The third passage includes a curvature and may be disposed inside the bracket.

Advantageous Effects

According to the present invention, has the advantage of effectively dissipating the heat generated by driving the heating element through the heat dissipation passage arranged along the circumference based on the heating element coupled in the bracket.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
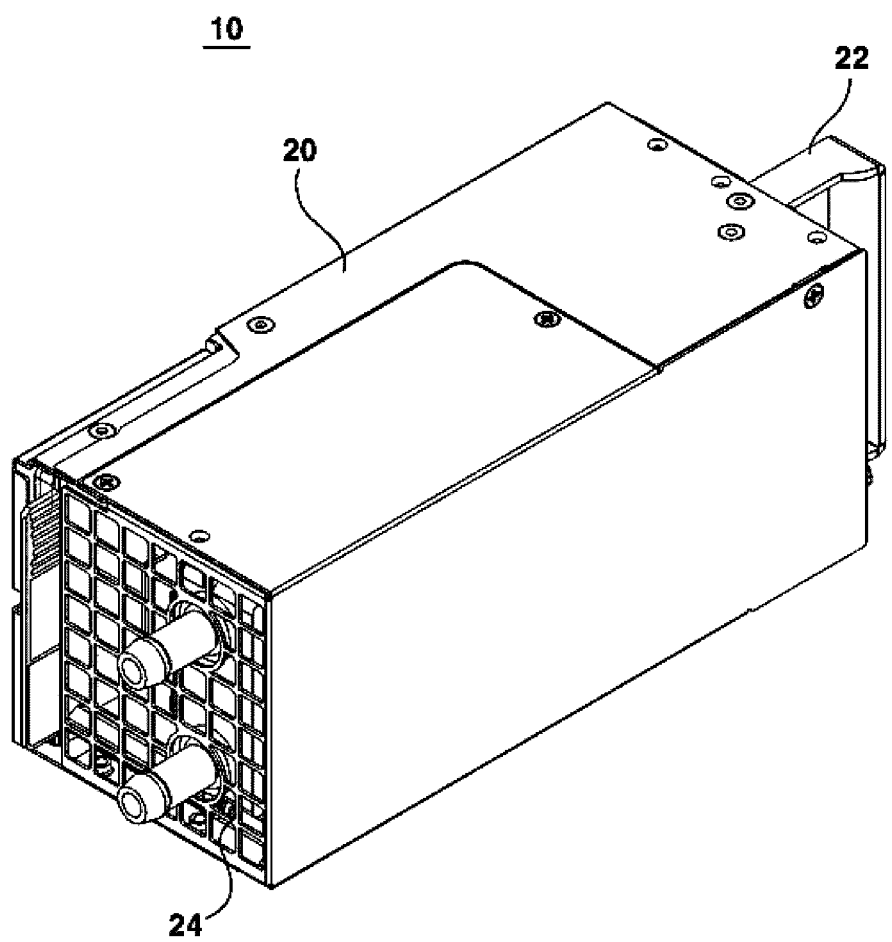
FIG. 1 is a perspective view of a power supply device according to an embodiment of the present invention.
Figure 2:
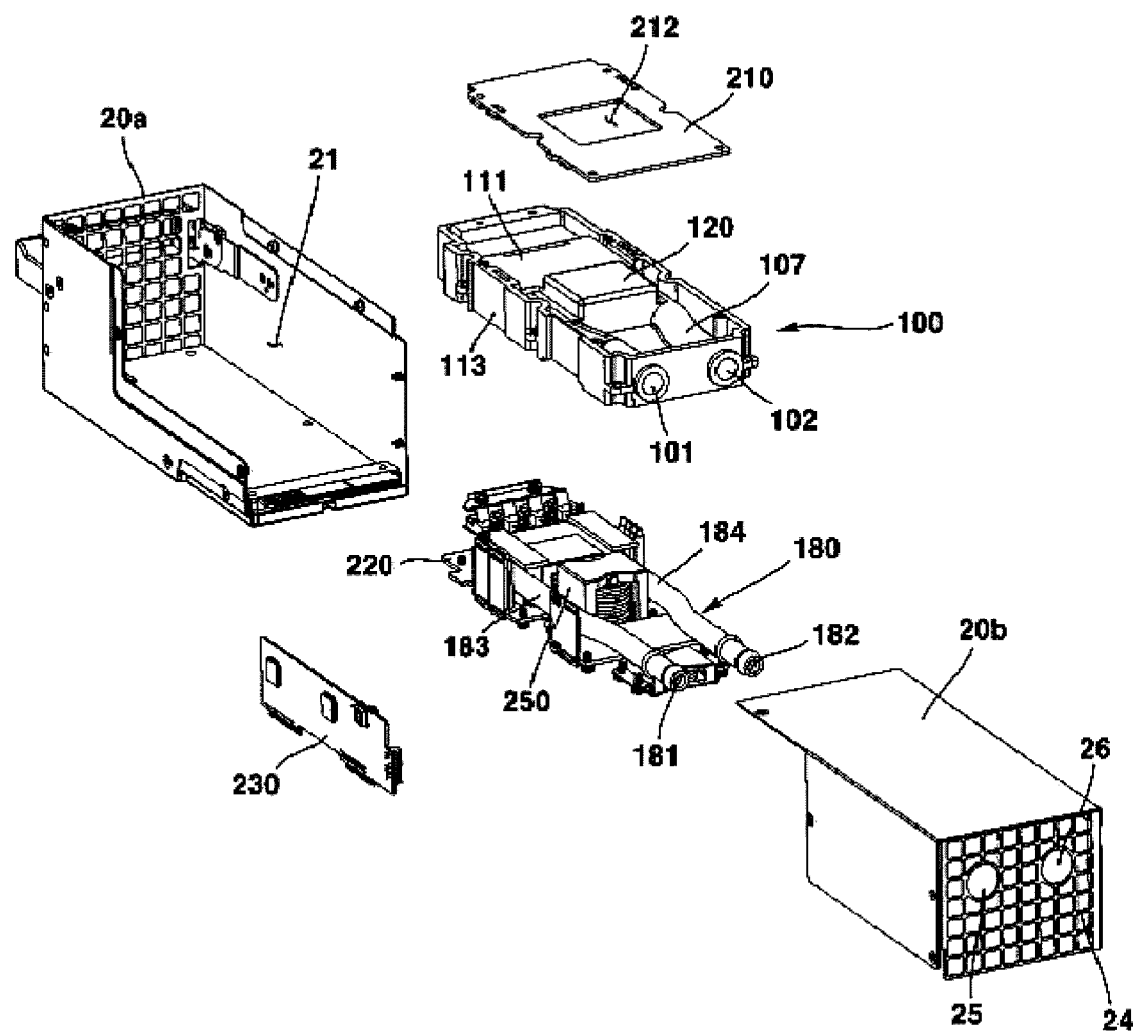
FIG. 2 is an exploded perspective view of a power supply device according to an embodiment of the present invention.
Figure 3:
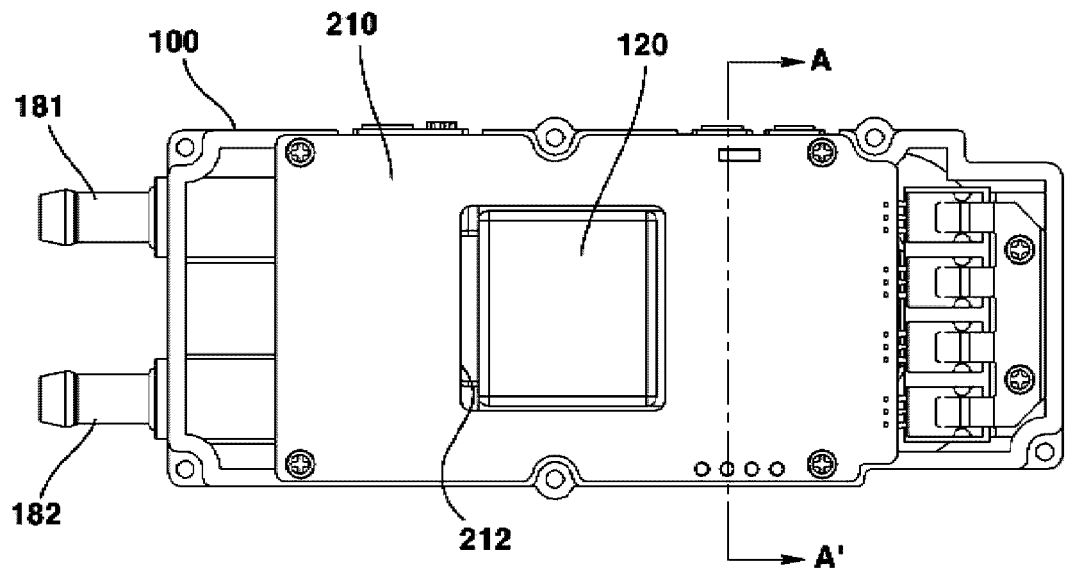
FIG. 3 is a plan view illustrating an upper surface of an electronic device according to an embodiment of the present invention.
Figure 4:
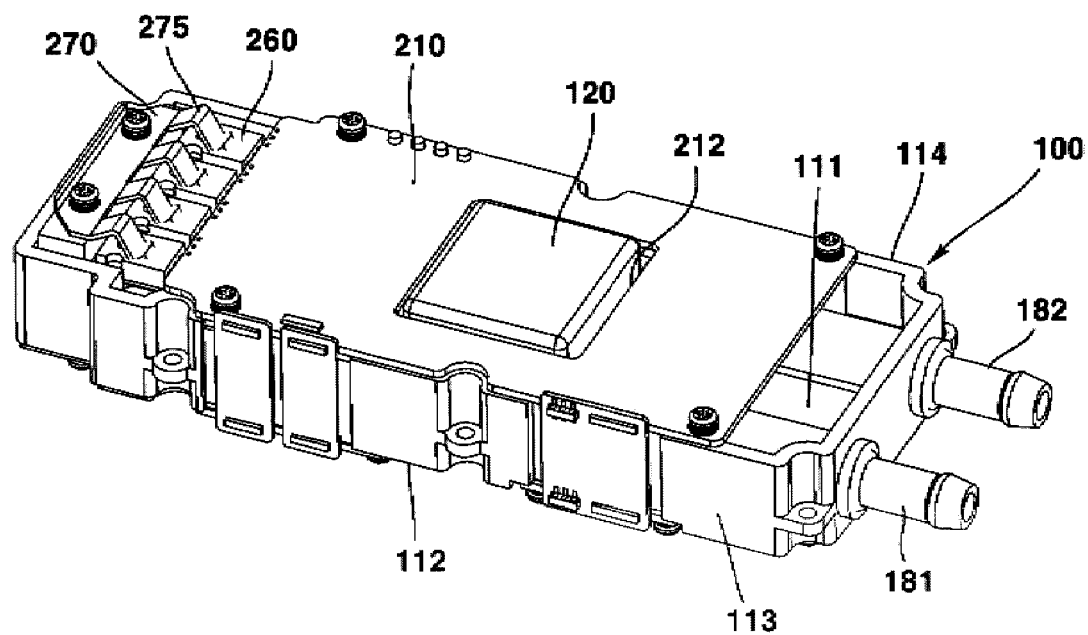
FIG. 4 is a perspective view of an electronic device according to an embodiment of the present invention.
Figure 5:
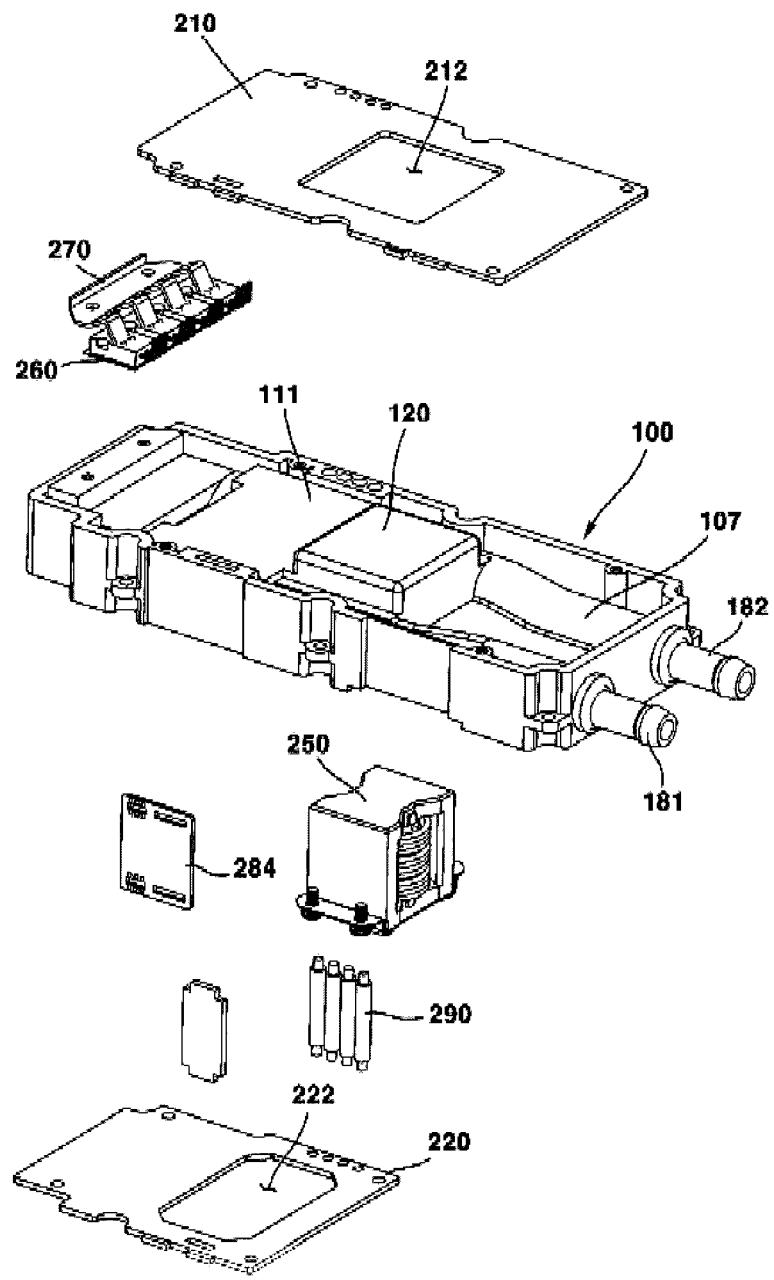
FIG. 5 is an exploded perspective view of an electronic device according to an embodiment of the present invention.
Figure 6:
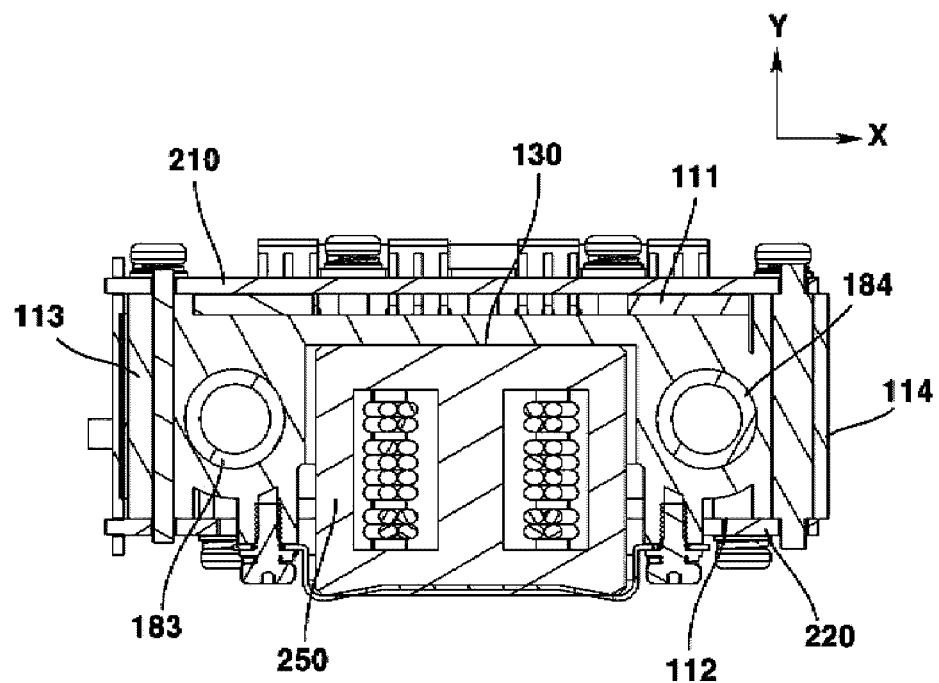
FIG. 6 is a cross-sectional view taken along line A-A' of FIG. 3.
Figure 7:
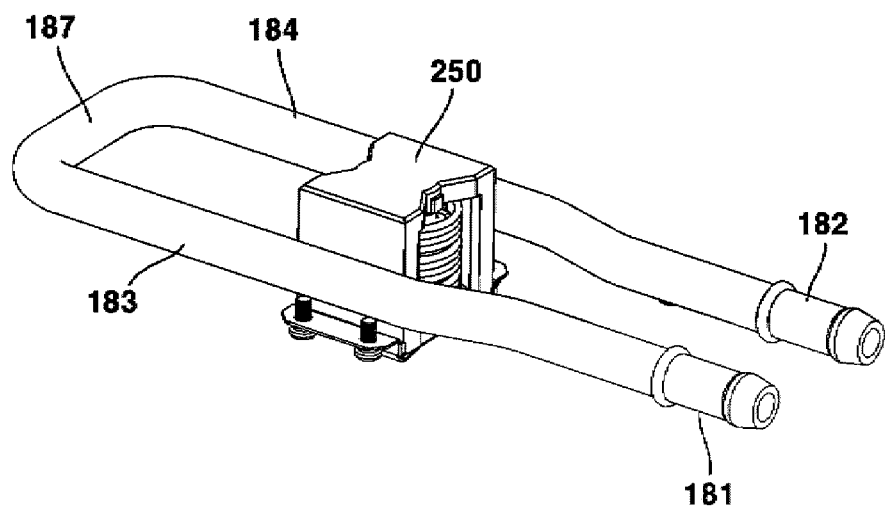
FIG. 7 is a conceptual diagram for explaining the arrangement structure of a heat dissipation passage and a heating element according to an embodiment of the present invention.

FIG. 1 is a perspective view of a power supply device according to an embodiment of the present invention; FIG. 2 is an exploded perspective view of a power supply device according to an embodiment of the present invention; FIG. 3 is a plan view illustrating an upper surface of an electronic device according to an embodiment of the present invention; FIG. 4 is a perspective view of an electronic device according to an embodiment of the present invention; FIG. 5 is an exploded perspective view of an electronic device according to an embodiment of the present invention; FIG. 6 is a cross-sectional view taken along line A-A' of FIG. 3; and FIG. 7 is a conceptual diagram for explaining the arrangement structure of a heat dissipation passage and a heating element according to an embodiment of the present invention.

Referring to FIGS. 1 to 7, the power supply device 10 according to an embodiment of the present invention is for supplying power to an electronic device such as a computer, and an outer shape may be formed by the housing 20. The housing 20 may have a regular hexahedron or rectangular parallelepiped shape. A space 21 may be formed inside the housing 20 so that an electronic device including a heat radiation module, which will be described later, is disposed.

A handle 22 being gripped by a user may be disposed on one side surface of the housing 20. A plurality of holes 25 and 26 through which a heat dissipation passage 180, which will be described later, may be formed on the other side surface of the housing 20 facing one side surface. The plurality of holes 25 and 26 may be formed to penetrate through an outer surface of the housing 20 from an inner surface. The plurality of holes 25 and 26 may include a first hole 25 through which one end of the heat dissipation passage 180 penetrates and a second hole 26 through which the other end of the heat dissipation passage 180 penetrates. One end and the other end of the heat dissipation passage 180 may be disposed to be protruded towards the outside of the housing 20 through the plurality of holes 25 and 26.

On the other side surface of the housing 20 on which the plurality of holes 25 and 26 are formed, a heat dissipation pattern 24 may be formed to increase a cross-sectional area of the other side surface of the housing 20. At least a portion of the heat dissipation pattern 24 has a shape being protruded from the other side surface of the housing 20 or may have a shape of a groove being recessed inward.

Meanwhile, the housing 20 may be formed by coupling a first housing 20a and a second housing 20b. Unlike this, the housing 20 may be implemented as a single body.

An electronic device may be disposed inside the housing 20. The electronic device may include printed circuit boards 210 and 220, heating elements 250 and 260, a bracket 100 and a heat dissipation passage 180. By a combination of the bracket 100 and the heat dissipation passage 180, the electronic device may include a heat radiation module.

The bracket 100 forms the outer shape of the electronic device, and the printed circuit boards 210 and 220, the heating elements 250 and 260, and the heat dissipation passage 180 may be coupled.

It may include the bracket 100, an upper surface 111, a lower surface 112 facing the upper surface 111, a first side surface 113 connecting the upper surface 111 and the lower surface 112, and a second side surface 114 facing the first side surface 113 and connecting the upper surface 111 and the lower surface 112. The bracket 100 may have a substantially rectangular parallelepiped shape. The bracket 100 may be formed of a plastic material.

A region in which a heating element 250, which will be described later, is disposed may be formed on at least one of an upper surface 111 and a lower surface 112 of the bracket 100. The region may be a groove 130 (refer to FIG. 6). For example, the groove 130 may be recessed more upward than other regions from the lower surface 112 of the bracket 100. The groove 130 may be disposed approximately in a central region of the bracket 100. A protruded portion 120 being protruded more upward than other regions may be disposed on an upper surface 111 of the bracket 100 corresponding to the region where the groove 130 is formed.

A space portion 107 in which a heat dissipation passage 180, which will be described late, is disposed may be formed inside the bracket 100. At least a portion of the heat dissipation passage 180 may be accommodated in the space portion 107. The first hole 101 and the second hole 102 may be formed on a side surface connecting the first side surface 113 and the second side surface 114 of the bracket 100. The space portion 107 may be a region whose both ends are defined by the first hole 101 and the second hole 102. One end and the other end of the heat dissipation passage 180 may be disposed to be protruded outward of the bracket 100 through the first hole 101 and the second hole 102, respectively.

A cross-sectional shape of the space portion 107 may be formed to correspond to a cross-sectional shape of the heat dissipation passage 180.

Figure 12:
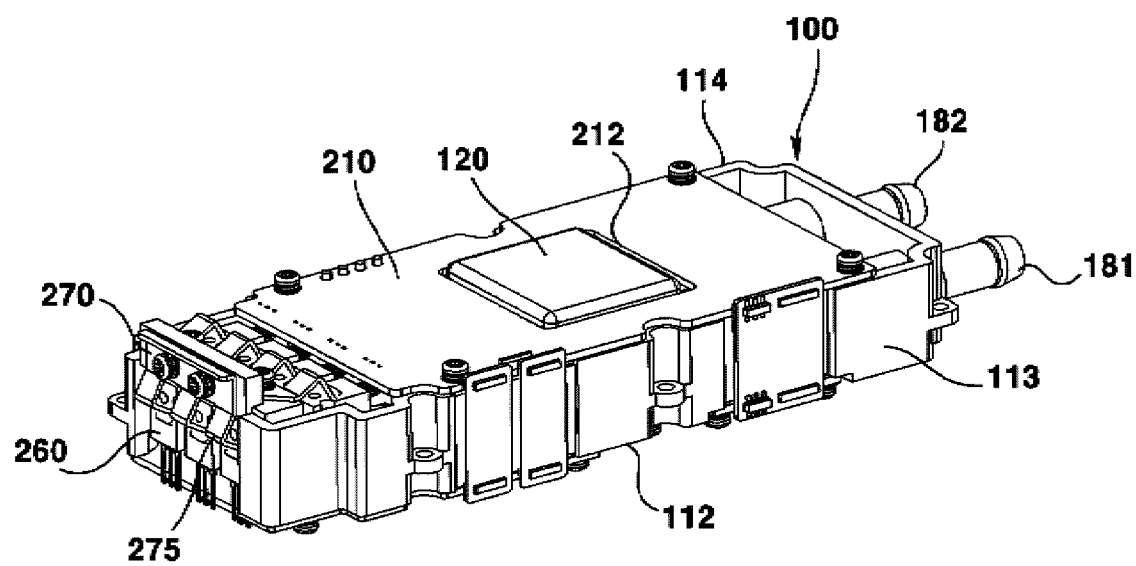
FIG. 12 is a view illustrating a modified embodiment of a second heating element arrangement according to an embodiment of the present invention.

As described above, the printed circuit boards 210 and 220 and the heating elements 250 and 260 may be coupled to the bracket 100. For example, the heating elements 250 and 260 include a first heating element 250 and a second heating element 260, and the first heating element 250 may be disposed in the groove 130. The second heating element 260 may be disposed on an upper surface 111 of the bracket 100. A fixing bracket 270 fixing the second heating element 260 on the bracket 100 may be provided on an upper surface of the bracket 100. At least a portion of the fixing bracket 270 may include a pressing part 275 pressurizing the upper surface of the second heating element 260, and may be screw-coupled onto the bracket 100. In the present embodiment, the structure in which the second heating element 260 is disposed on an upper surface 111 of the bracket 100 has been described, but if necessary, as shown in FIG. 12, a second heating element 260 may be disposed on a side surface facing another side surface connecting the first side surface 113 and the second side surface 114 of the bracket 100, that is, on which the first hole 101 and the second hole 102 are formed. In this case, the heat of the second heating element 260 may dissipate the heat in a side surface direction rather than an upper direction of the third passage 187 of the heat dissipation passage 180, which will be described later. In this case, the upper end of the side surface where the second heating element 260 is disposed may be protruded more upward than the upper surface of the bracket 100 so that the fixing bracket 270 is disposed thereon. In addition, when the second heating element 260 is disposed as shown in FIG. 12, the second heating element 260 may be disposed to be overlapped with the space portion 107 or the heat dissipation passage 180 in a horizontal direction.

The first heating element 250 may include an inductor for obtaining inductance or a transformer for voltage conversion. The second heating element 260 may include an FET device or a diode.

The heating elements 250 and 260 may generate heat by being driven. The heating elements 250 and 260 may be electrically connected to the printed circuit boards 210 and 220.

The printed circuit boards 210 and 220 may include a first printed circuit board 210 disposed on the upper surface 111 of the bracket 100 and a second printed circuit board 220 disposed on the lower surface 112 of the bracket 100. The first printed circuit board 210 and the second printed circuit board 220 may be disposed to be overlapped with each other in a vertical direction. The first printed circuit board 210 is screw-coupled to an upper surface 111 of the bracket 100, and the second printed circuit board 220 may be screw-coupled to a lower surface 112 of the bracket 100. Other than this, it may be fixed using other coupling members. The coupling structure of the first printed circuit board 210 and the second printed circuit board 220 will be described later.

The first printed circuit board 210 may include a through hole 212 penetrating a lower surface from an upper surface. The through hole 212 may be disposed in a region facing the protruded portion 120 of an upper surface of the bracket 100. At least a portion of the protruded portion 120 may be protruded upward from the first printed circuit board 210 by penetrating through the through hole 212.

The second printed circuit board 220 may include a through hole 222 penetrating a lower surface from an upper surface. The through hole 222 may be disposed in a region facing the first heating element 250 in a vertical direction. At least a portion of the first heating element 250 may be disposed to penetrate through the through hole 222. Another portion of the first heating element 250 may be electrically coupled to the second printed circuit board 220.

In this embodiment, it is exemplified that the groove 130 in which the first heating element 250 is disposed is formed on a lower surface of the bracket 100, but unlike this, the groove 130 may be formed on an upper surface of the bracket 100. In this case, the protruded portion 120 may be formed to be protruded downward from a lower surface of the bracket 100.

The heat dissipation passage 180 may be coupled to the bracket 100. At least a portion of the heat dissipation passage 180 may be disposed inside the space portion 107. A passage through which a refrigerant flows may be formed inside the heat dissipation passage 180. The heat dissipation passage 180 may be a refrigerant pipe in which a refrigerant flows. An inlet 181 into which the refrigerant flows is formed at one end of the heat dissipation passage 180, and an outlet 182 through which the refrigerant that has been circulated along the passage is discharged may be formed at the other end of the heat dissipation passage 180. The inlet 181 and the outlet 182 may be disposed to be protruded from an outer surface of the bracket 100.

In more detail, the heat dissipation passage 180 may include a first passage 183 being disposed between one side of the groove 130 and the first side surface 113 and a second passage 184 being disposed between the second side surface 114 and the other side of the groove 130 facing the one side. At least a portion of the first passage 183 and the second passage 184 may be disposed parallel to each other. At least a portion of the first passage 183 and the second passage 184 may be disposed adjacent to at least two side surfaces of the groove 130 as shown in FIG. 6.

A portion of the heat dissipation passage 180 may be disposed to be overlapped with the groove 130 in a first direction perpendicular to a side surface of the groove 130. A portion of the first passage 183 may be disposed to be overlapped with the groove 130 in a direction directing from the first side surface 113 to the second side surface 114. A part of the second passage 184 may be disposed to be overlapped with the groove 130 in a direction directing from the second side surface 114 to the first side surface 113.

The heat dissipation passage 180 may include a third passage 187 connecting the first passage 183 and the second passage 184. In more detail, when assuming that the regions of the first passage 183 and the second passage 184 being protruded on an outer surface of the bracket 100 and the region of the second passage 184 are one side of the first passage 183 and one side of the second passage 184, respectively, the other side of the first passage 183 is connected to one end of the third passage 187, and the other side of the second passage 184 may be connected to the other end of the third passage 187.

The third passage 187 may be disposed perpendicular to at least some regions of the first passage 183 and the second passage 184. At least a portion of the third passage 187 may have a curvature. The third passage 187 may be accommodated in the space portion 107 of the bracket 100. The first passage 183, the second passage 184, and the third passage 187 may be disposed along the circumference of the first heating element 250. The first passage 183, the second passage 184, and the third passage 187 may be disposed on the same plane.

As shown in FIG. 7, the distance between one side of the first passage 183 and the second passage 184 may be smaller than or equal to the distance between the first passage 183 and the second passage 184 being disposed in the region being overlapped with the first heating element 250. One side of the first passage 183 and the second passage 183 may mean a region between the first passage 183 and the inlet 183 and between the second passage 184 and the outlet 182 in the heat dissipation passage 180.

In addition, based on the first direction X directing from the first side surface 113 to the second side surface 114, the length of the first heating element 250 may be smaller than the distance between the first passage 183 and the second passage 184 being disposed in a region being overlapped with the first heating element 250.

Meanwhile, the height of the first heating element 250 in a second direction Y perpendicular to the first direction X may be greater than or equal to the height of the heat dissipation passage 180. In addition, the uppermost surface of the bracket 100 in the second direction Y may be an upper surface corresponding to the bottom surface of the groove 130.

According to the structure as described above, through the heat dissipation passage 180 being disposed along the circumference with respect to the first heating element 250 being coupled inside the bracket 100, there is an advantage in that the heat generated by the first heating element 250 by being driven can be effectively dissipated. Hereinafter, a coupling structure of the bracket 100, the first printed circuit board 210, and the second printed circuit board 220 will be described.

FIGS. 8 to 11 are perspective views illustrating a coupling structure of a first printed circuit board and a second printed circuit board according to an embodiment of the present invention.

Referring to FIGS. 3 to 11, as described above, the first printed circuit board 210 and the second printed circuit board 220 are respectively disposed on an upper and a lower surfaces of the bracket 100 to heat-radiating It may be electrically connected to the elements 250 and 260.

On the other hand, the electronic device may include: plates 282 and 284 connecting the first printed circuit board 210; and a second printed circuit board 220; and bus bars 289 and 290. The first printed circuit board 210 and the second printed circuit board 220 may be electrically and physically coupled to each other through the plates 282 and 284 and the bus bars 289 and 290. The plates 282 and 284 and the bus bars 289 and 290 may be disposed to be overlapped with the first heating element 250 and the heat dissipation passage 180 in a first direction X.

Figure 8:
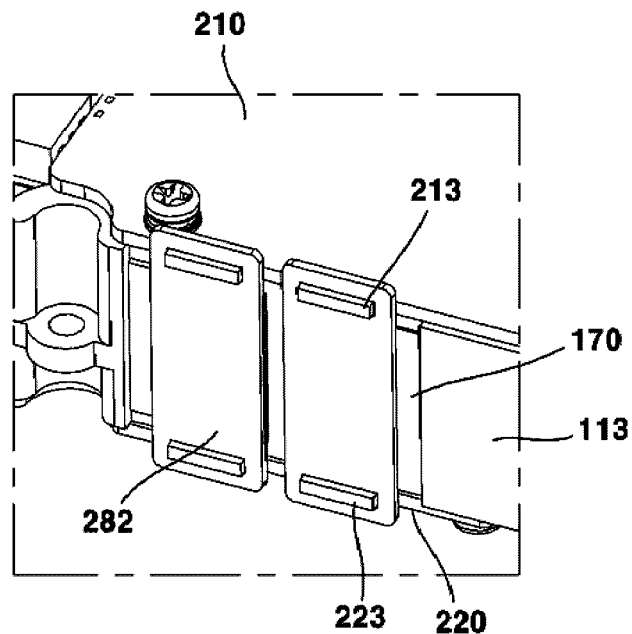
FIGS. 8 to 11 are perspective views illustrating a coupling structure of a first printed circuit board and a second printed circuit board according to an embodiment of the present invention.

In detail, referring to FIG. 8, the first printed circuit board 210 and the second printed circuit board 220 may be interconnected through a first plate 282. Among the side surfaces of the first printed circuit board 210 and the side surface of the second printed circuit board 220, ribs 213 and 223 being protruded more outward than other regions in the region facing the first plate 282 may be formed. A hole through which the ribs 213 and 223 penetrate may be formed in the first plate 282 facing the ribs 213 and 223. Accordingly, the ribs 213 and 223 are coupled to the holes so that the first printed circuit board 210 and the second printed circuit board 220 can be mutually coupled through the first plate 282. The first plate 282 may be formed of a metal material. Thus, the first printed circuit board 210 and the second printed circuit board 220 are electrically connected to each other through the first plate 282, and a current may be transmitted through the ribs 213 and 223 coupled to the hole of the first plate 282.

Meanwhile, a heat transfer pad 170 is interposed between the inner surface of the first plate 282 and the first side surface 113 so that the heat of the first plate 282 can be transferred to the radiating passage 180 through the heat transfer pad 170. The heat transfer pad 170 may be disposed on a path where the first plate 282 is being overlapped with the heat dissipation passage 180.

Figure 9:
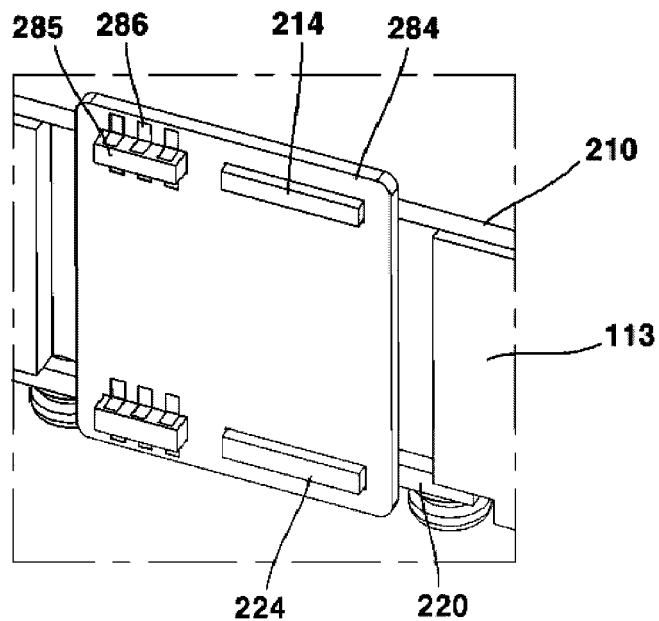
Figure 10:
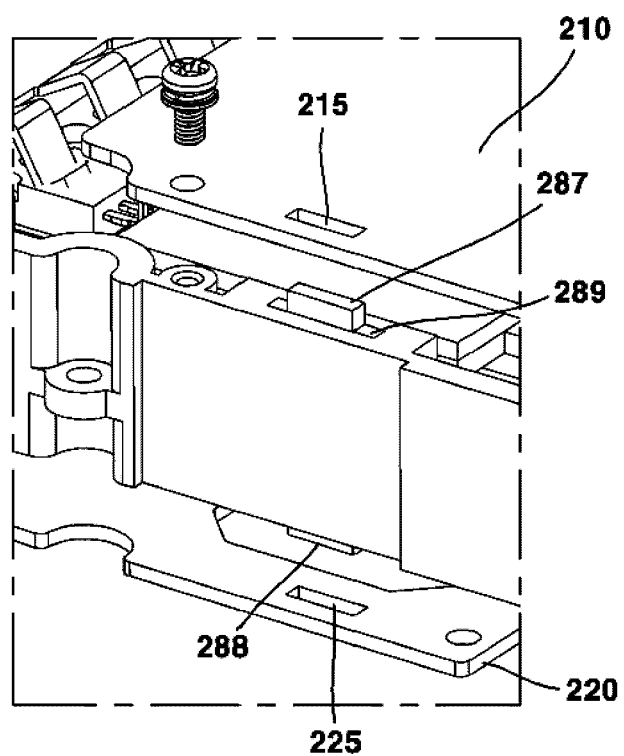

Referring to FIG. 9, the first printed circuit board 210 and the second printed circuit board 220 may be interconnected through a second plate 284. In a region facing the second plate 284 among the side surface of the first printed circuit board 210 and the side surface of the second printed circuit board 220, ribs 214 and 224 being protruded more outward than other regions may be formed. A hole through which the ribs 214 and 224 penetrate may be formed in the second plate 284 facing the ribs 214 and 224. Accordingly, the ribs 214 and 224 are coupled to the hole so that the first printed circuit board 210 and the second printed circuit board 220 may be mutually coupled through the second plate 284. The second plate 284 may be formed of a metal material. Similarly, a heat transfer pad (not shown) may be disposed between an inner surface of the second plate 284 and a side surface of the bracket 100.

Meanwhile, a separate rib 285 being protruded outward may be additionally formed on side surfaces of the first printed circuit board 210 and the second printed circuit board 220. The separate rib 285 may be disposed in a region being spaced apart from the ribs 214 and 224 in a horizontal direction. The separate rib 285 may be referred to as a second rib. A hole may be formed in the second plate 284 so that the second rib 285 penetrates therethrough.

A circuit pattern may be formed on at least one surface of upper and lower surfaces of the second rib 285. A circuit pattern 286 may be similarly formed on an outer surface of the second plate 284 adjacent to the hole to which the second rib 285 is coupled. Accordingly, the second plate 284 may be soldered to the first printed circuit board 210 or the second printed circuit board 220 through the second rib 285. Thus, the first printed circuit board 210 and the second printed circuit board 220 are electrically connected to each other through the second plate 284, and a current may be transferred through the ribs 214, 224, and 285 coupled to the holes of the second plate 284. Here, the second rib 285 is soldered to the circuit pattern 286 and does not simply transmit current, but may be an intermediate transferring the signal of the first printed circuit board 210 or the signal of the second printed circuit board 220 to each other Referring to FIG. 10, the first printed circuit board 210 and the second printed circuit board 220 may be mutually coupled through a bus bar 289. The bus bar 289 may be formed of a metal material and disposed inside the bracket 100. The bus bar 289 may be formed integrally with the bracket 100 by insert injection molding. The bus bar 289 may be disposed on a side surface of the bracket 100. The ribs 287 and 288 being protruded more upward or downward than an upper surface and lower surface of the bracket 100 may be formed at an upper and a lower ends of the bus bar 289, respectively.

In addition, in the first printed circuit board 210 and the second printed circuit board 220 facing the ribs 287 and 288, through holes 215 and 225 penetrating the lower surface from the upper surface, respectively, may be formed. Accordingly, the ribs 287 and 288 are coupled to the through holes 215 and 225, and the first printed circuit board 210 and the second printed circuit board 220 may be mutually coupled through the bus bar 289. Thus, the first printed circuit board 210 and the second printed circuit board 220 are electrically connected to each other through the bus bar 289, and a current can be transferred through the ribs 287 and 288 coupled to the through holes 215 and 225 of the first printed circuit board 210 and the second printed circuit board 220.

Meanwhile, the bus bar 289 may be formed in a plate shape made of a metal material, and a heat transfer pad (not shown) may be disposed on an inner surface of the bus bar 289. The heat transfer pad may be disposed between the bus bar 289 and the heat dissipation passage 180.

Figure 11:
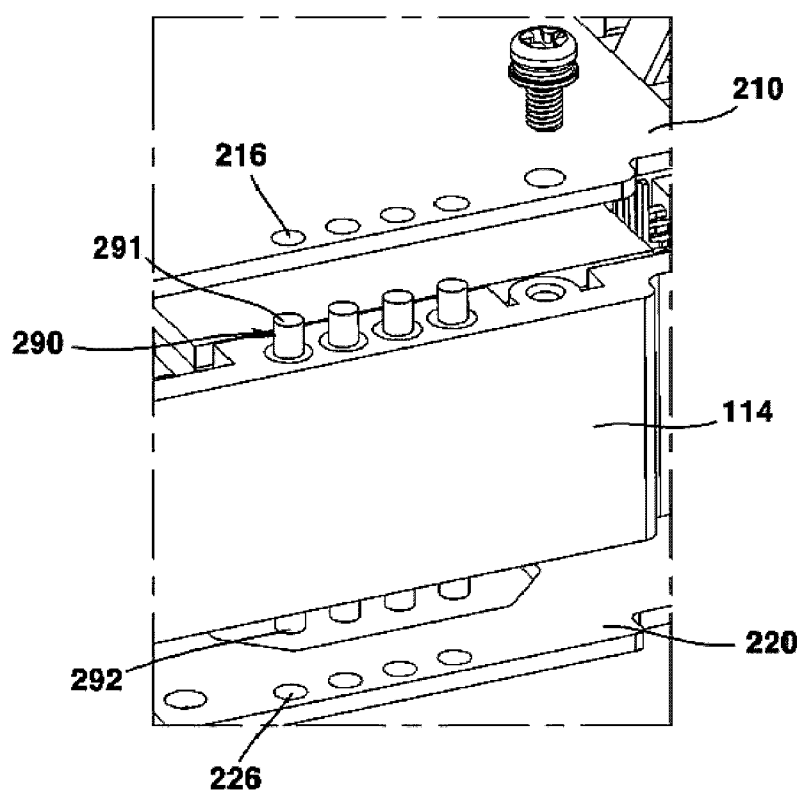

Referring to FIG. 11, the first printed circuit board 210 and the second printed circuit board 220 may be mutually coupled through a bus bar 290. The bus bar 290 is formed of a metal material and may be disposed inside the bracket 100. The bus bar 290 may be formed integrally with the bracket 100 by insert injection molding. The bus bar 290 may be disposed on a side surface of the bracket 100. The ribs 291 and 292 being protruded more upward or downward than an upper surface and a lower surface of the bracket 100 may be formed at an upper and a lower ends of the bus bar 290, respectively.

In addition, through-holes 216 and 226 penetrating from an upper surface to a lower surface may be formed in the first printed circuit board 210 and the second printed circuit board 220 facing the ribs 291 and 292, respectively. Accordingly, the ribs 291 and 292 are coupled to the through holes 216 and 226, and the first printed circuit board 210 and the second printed circuit board 220 may be mutually coupled through the bus bar 290. Thus, the first printed circuit board 210 and the second printed circuit board 220 are electrically connected to each other through the bus bar 290, and a current can be transferred through the ribs 291 and 292 coupled to the through holes 216 and 226 of the first printed circuit board 210 and the second printed circuit board 220.

Meanwhile, the bus bar 290 may be formed in a rod shape made of a metal material and may have a circular cross section. A heat transfer pad (not shown) may be disposed on an outer circumferential surface of the bus bar 290 being accommodated inside the bracket 100.

The bus bar 290 may be provided in plural and disposed to be spaced apart from each other in a horizontal direction.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. An electronic device comprising:
a substrate;
a heating element being electrically connected to the substrate;
a bracket having a region in which at least a portion of the heating element is disposed; and
a heat dissipation passage being disposed inside the bracket,
wherein the substrate includes a first substrate being disposed on one side of the bracket, a second substrate being disposed on the other side of the bracket, and a plate connecting the first substrate and the second substrate,
wherein the heat dissipation passage is disposed between the first substrate and the second substrate, and
wherein the heating element, the plate, and a portion of the heat dissipation passage are being overlapped in a first direction.

2. The electronic device according to claim 1, wherein a height of the heating element in a second direction perpendicular to the first direction is greater than or equal to a height of the heat dissipation passage.

3. The electronic device according to claim 1, wherein the plate includes a first plate disposed on one side of the bracket and a second plate disposed on the other side of the bracket, and
wherein the heat dissipation passage includes a first heat dissipation passage disposed closer to the first plate than the second plate, and a second heat dissipation passage disposed closer to the second plate than the first plate.

4. The electronic device according to claim 1, wherein the first substrate and the second substrate include a plurality of through holes, and
   wherein a portion of the plate is disposed in the through hole of the first substrate and the second substrate.

5. The electronic device according to claim 1, wherein a rib is formed on a side surface of the first substrate and a side surface of the second substrate, respectively, and
   wherein the plate includes a hole to which the rib is coupled.

6. The electronic device according to claim 1, wherein one area of the plate is placed inside the bracket.

7. The electronic device according to claim 1, wherein a heat transfer pad is disposed on an inner surface of the plate, and
   wherein the heat transfer pad is disposed between the plate and the heat dissipation passage.

8. The electronic device according to claim 1, wherein the first substrate includes a first groove in which one area of the bracket is disposed.

9. The electronic device according to claim 1, wherein the second substrate includes a second groove through which the heating element passes.

10. The electronic device according to claim 1, wherein a groove is formed concavely on one surface of the bracket, and
    wherein one region of the heating element is disposed within the groove.

11. An electronic device comprising:
    a substrate;
    a heating element being electrically connected to the substrate;
    a bracket including a groove in which the heating element is disposed on at least one of upper and lower surfaces; and
    a heat dissipation passage disposed within the bracket,
    wherein the heat dissipation passage includes a first passage disposed between one side of the groove and a first side of the bracket and a second passage disposed between an other side of the groove and a second side of the bracket, and
    wherein the first passage and the second passage overlap the groove in a direction from the first side surface to the second side surface.

12. The electronic device according to claim 11, wherein the heat dissipation passage includes a third passage connecting one end of the first passage and one end of the second passage.

13. The electronic device according to claim 12, wherein the other end of the first passage is exposed to one surface of the bracket,
    wherein one end of the first passage is connected to one end of the third passage,
    wherein the other end of the second passage is exposed to one side of the bracket, and
    wherein one end of the second passage is connected to the other end of the third passage.

14. The electronic device according to claim 12, wherein the third passage includes a curvature and is disposed within the bracket.

15. The electronic device according to claim 12, wherein at least some of the first to third passages are disposed around the heating element.

16. The electronic device according to claim 11, wherein a distance between one side of the first passage and one side of the second passage is smaller than or equal to a distance between the first passage and the second passage disposed in an area overlapping the heating element.

17. The electronic device according to claim 11, wherein a length of the heating element based on the first direction is smaller than a distance between the first passage and the second passage disposed in an area overlapping the heating element.

18. The electronic device according to claim 12, wherein the first passage, the second passage and the third passage are disposed on the same plane.

19. The electronic device according to claim 11, wherein a height of the heating element in a second direction perpendicular to the first direction is greater than or equal to a height of the heat dissipation passage.

20. A heat radiation module comprising:
    a bracket having an upper surface, a lower surface, and a first side surface for connecting the upper surface and the lower surface, and a second side surface facing the first side surface; and
    a heat dissipation passage being disposed inside the bracket,
    wherein the bracket includes a groove formed on at least one surface among the upper surface and the lower surface,
    wherein a heating element is disposed in the groove,
    wherein the heat dissipation passage includes a first passage being disposed between one side of the groove and the first side surface, and a second passage being disposed between the other side of the groove and the second side surface, and
    wherein a portion of the first passage is overlapped with the groove being extended in a direction directing from the first side surface toward the second side surface.

\* \* \* \* \*